United States Patent
Moddel (10) Patent No.: US 8,803,340 B2
(45) Date of Patent: Aug. 12, 2014

(54) GEOMETRIC DIODE, APPLICATIONS AND METHOD

(75) Inventor: Garret Moddel, Boulder, CO (US)

(73) Assignee: The Regents of the University of Colorado, a Body Corporate, Denver, CO (US)

( * ) Notice: Subject to any disclaimer, the term of this patent is extended or adjusted under 35 U.S.C. 154(b) by 988 days.

(21) Appl. No.: 12/935,099

(22) PCT Filed: Jul. 17, 2009

(86) PCT No.: PCT/US2009/051000
§ 371 (c)(1),
(2), (4) Date: Sep. 28, 2010

(87) PCT Pub. No.: WO2010/009401
PCT Pub. Date: Jan. 21, 2010

(65) Prior Publication Data
US 2011/0017284 A1    Jan. 27, 2011

Related U.S. Application Data

(60) Provisional application No. 61/081,912, filed on Jul. 18, 2008.

(51) Int. Cl.
*H01L 23/58* (2006.01)
(52) U.S. Cl.
USPC ......................................................... 257/798
(58) Field of Classification Search
USPC ................... 257/466, 798; 136/252
See application file for complete search history.

(56) References Cited

U.S. PATENT DOCUMENTS

| | | |
|---|---|---|
| 4,023,196 A | 5/1977 | Kataoka et al. |
| 4,231,058 A | 10/1980 | Gleason |
| 6,762,071 B2 | 7/2004 | Eliasson |

OTHER PUBLICATIONS

H. Linke et al., "A Quantum Dot Ratchet: Experiment and Theory," Europhysics Letters, 44 (3), pp. 341-347.*
H. Linke et al., A Quantum Dot Ratchet: Experiment and Theory, Europhysics Letters, 44 (3), pp. 341-347, Nov. 1, 1998.
Peter Hanggi et al., Quantum Ratchets Reroute Electrons, Physics World, pp. 21-22, Mar. 1999, IOP Publishing.
A. Mayer et al., Rectification Properties of Geometrically Asymmetric Metal-Vacuum-Metal Junctions: A Comparison of Tungsten and Silver Tips to Determine the Effects of Polarization Resonances, Journal of Physics: Condensed Matter 21 (2009) 395304 (7pp), Sep. 8, 2009, IOP Publishing.

(Continued)

*Primary Examiner* — Matthew Reames
*Assistant Examiner* — Nicholas J Choi
(74) *Attorney, Agent, or Firm* — Pritzkau Patent Group, LLC (57) ABSTRACT

A geometric diode, method and device applications are described. The geometric diode is produced including a device body formed from an electrically conductive material having an equilibrium mobile charge density, and having a device surface configuration. The material has a charge carrier mean free path with a mean free path length and the device body size is selected based on said free path length to serve as an electrically conductive path between first and second electrodes delimited by the device surface configuration that is asymmetric with respect to a forward flow of current in a forward direction from the first electrode to the second electrode as compared to a reverse current flow in an reverse direction from the second electrode to the first electrode. A system includes an antenna for receiving electromagnetic radiation coupled with the geometric diode antenna to receive the electromagnetic radiation to produce an electrical response.

11 Claims, 5 Drawing Sheets

(56) References Cited

OTHER PUBLICATIONS

A.M. Song et al., Nonlinear Electron Transport in an Asymmetric Microjunction: A Ballistic Rectifier, Physical Review Letters, vol. 80, No. 17, Apr. 27, 1998, pp. 3831-3834, The American Physical Society.

Supriyo Datta et al., Steady-State Transport in Mesoscopic Systems Illuminated by Alternating Fields, Rapid Communications, Physical Review B, vol. 45, No. 23, Jun. 15, 1992, pp. 13761-13764, The American Physical Society.

J. Liu et al., Nonlinear Response of a Mesoscopic System, Physica B 165 & 166, 1990, pp. 279-280, Elsevier Science Publishers B.V. (North-Holland).

D.J. Thouless, The Effect of Inelastic Electron Scattering on the Conductivity of Very Thin Wires, Solid State Communications, Jan. 22, 1980, vol. 34, pp. 683-685, Pergamon Press Ltd., Great Britain.

* cited by examiner

GEOMETRIC DIODE, APPLICATIONS AND METHOD

RELATED APPLICATION

The present application claims priority from U.S. Provisional Patent Application Ser. No. 61/081,912, filed on Jul. 18, 2008, the contents of which are incorporated herein by reference.

OVERVIEW

A geometric diode, method and device applications are described. The geometric diode is produced including a device body formed from an electrically conductive material having an equilibrium mobile charge density, and having a device surface configuration. The material has a charge carrier mean free path with a mean free path length and the device body size is selected based on said the free path length to serve as an electrically conductive path between first and second electrodes delimited by the device surface configuration that is asymmetric with respect to a forward flow of current in a forward direction from the first electrode to the second electrode as compared to a reverse current flow in an reverse direction from the second electrode to the first electrode. A system includes an antenna for receiving electromagnetic radiation coupled with the geometric diode antenna to receive the electromagnetic radiation to produce an electrical response.

BACKGROUND

The present disclosure is related generally to the field of devices that exhibit diode behavior and, more particularly, to a geometric diode device, method and associated applications wherein the geometric diode is formed from an electrically conductive material.

The prior art contains numerous examples of devices that exhibit diode behavior in various applications. Most often, diodes are formed using semiconductor materials. As will be seen, Applicant recognizes herein that the use of semiconductor materials is problematic for a number of reasons.

In the prior art, most diodes are in a parallel-plate/sandwich geometry which results in a substantial capacitance between the plates. This capacitance results in a substantial RC time constant, which often limits the response time of the diode. Reducing the physical size of the device beneficially reduces the capacitance, however, the resistance of the device increases responsive to decreasing the size. These issues will be addressed further at one or more appropriate points below.

Applicant recognizes that a fundamental limit to the conversion efficiency of semiconductor photovoltaic cells results from the semiconductor bandgap of the semiconductor material, such that photons below the bandgap energy are thrown out or wasted and those with energy above the bandgap yield, at most, that bandgap's energy. Multi-junction cells improve upon this, but have their own limitations. Applicant further recognizes that, if one could instead rectify the radiant electromagnetic energy in the same way that power supplies rectify AC power, conversion efficiencies approaching 100% could be obtained, at least in principle. If such rectification could be accomplished using a low-cost, thin-film technology, this would represent a revolutionary advance in solar cell technology. Applicant is not aware, however, of any reports of photovoltaic rectifiers having conversion efficiencies that are believed to be practical. Moreover, it is believed that the primary obstacle, in this regard is the diode itself for various reasons which will be brought to light at appropriate points below.

A general concern with respect to semiconductor devices relates to manufacturing costs since there is a need for relatively complex manufacturing procedures, as will be discussed in more detail at one or more appropriate points hereinafter.

A recent approach using semiconductor material is seen in U.S. Pat. No. 7,224,026 by Song, et al (hereinafter, the Song Patent). The operation of the described devices appears to be premised upon modulation of the width of a channel through the formation of depletion layers.

Song himself notably takes a different approach in a number of papers in the literature including: "Nonlinear Electron Transport in an Asymmetric Microjunction: A Ballistic Rectifier" which was published on Apr. 27, 1998 in Physical Review Letters; "Electron Ratchet Effect in Semiconductor Devices and Artificial Materials with Broken Centrosymmetry" which was published on Apr. 22, 2002 and appeared in Applied Physics A; and "Room-Temperature Ballistic Nanodevices" which published in the Encyclopedia of Nanoscience and Nanotechnology in 2004 (hereinafter, referred to as the Song papers). The Song papers, however, continue to rely on the use of semiconductor materials, which can be unsuitable in the applications that are described below.

Another recent approach is taken in U.S. Pat. No. 6,563,185 (hereinafter, the '185 patent) wherein a metal-insulator-metal electron tunneling-based device is described. While the '185 patent provided sweeping advantages over the then-existing state-of-the-art by utilizing metal/insulator layered technology, Applicant submits that the present application provides still further advantages.

The foregoing examples of the related art and limitations related therewith are intended to be illustrative and not exclusive. Other limitations of the related art will become apparent to those of skill in the art upon a reading of the specification and a study of the drawings.

REFERENCES

The materials which follow are referenced by above incorporated U.S. Provisional Application Ser. No. 61/081,912.
1. "Metal-Insulator Diodes for Solar Energy Conversion," Blake J. Eliasson, University of Colorado PhD Thesis, 2001.
2. R. Corkish, 1, M. A. Green and T. Puzzer, "Solar energy collection by antennas," Solar Energy, Volume 73, Issue 6, December 2002, Pages 395-401.
3. "Solar cells using arrays of optical rectennas," United States Patent Application 20070240757, Oct. 18, 2007 Ren; Zhifeng et al.
4. "Photovoltaic Technologies Beyond the Horizon: Optical Rectenna Solar Cell Final Report," B. Berland, February 2003, NREL/SR-520-33263.
5. "Detectors at the Intersection of Photons and Electromagnetic Fields or, Where Einstein Meets Maxwell," invited paper, B. Eliasson and G. Moddel, Spring Meeting of the Materials Research Society, San Francisco, Mar. 28-Apr. 1, 2005.
6. N. W. Ashcroft and N. D. Mermin, *Solid State Physics* (Holt, Rinehart and Winston, 1976), p. 38, 51-52.
7. M. C. Tringides, M Jatochowski, E. Bauer, "Quantum size effects in metallic nanostructures," Physics Today, April 2007, p. 50.

8. Hiratsuka, Y., et al. "Controlling the direction of kinesin-driven microtubule movements along microlithographic tracks," Biophysical Journal, 81, 1555-1561, 2001.
9. Fletcher and Bailey, 1973. Fletcher, J. C., Bailey, R. L., "Electromagnetic wave energy converter," U.S. Pat. No. 3,760,257 (1973).
10. "Device integrated antenna for use in resonant and non-resonant modes and method, Manoja D. Weiss, Blake J. Eliasson and Garret Moddel, U.S. Pat. No. 6,664,562 (2003).

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In general, a geometric diode, associated method and device applications are described. The geometric diode is produced including a device body formed from an electrically conductive material having an equilibrium mobile charge density, and the device body is formed having a device surface configuration. The material is further characterized by a charge carrier mean free path having a mean free path length and the device body has a device size that is selected based on said the free path length. At least a pair of first and second electrodes is defined on the device body such that the device body serves as an electrically conductive path between the first and second electrodes wherein the electrically conductive path is delimited by the device surface configuration and the device surface configuration is physically asymmetric with respect to a forward flow of current in a forward direction from the first electrode to the second electrode as compared to a reverse current flow in an reverse direction from the second electrode to the first electrode such that a magnitude of the current between the first electrode and the second electrode, as a function of a voltage between the pair of electrodes, is different in the forward direction from that in the reverse direction without a need for the formation of a depletion layer in the electrically conductive material to produce the difference in current magnitude.

In one feature a system includes an antenna for receiving electromagnetic radiation coupled with the geometric diode, as taught herein, for coupling with the antenna to receive the electromagnetic radiation to produce an electrical response that is available across the pair of electrodes.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be illustrative rather than limiting.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiment shown, but is to be accorded the widest scope consistent with the principles and features described herein including modifications and equivalents, as defined within the scope of the appended claims. It is noted that the drawings are not to scale and are diagrammatic in nature in a way that is thought to best illustrate features of interest. Descriptive terminology may be adopted for purposes of enhancing the reader's understanding, with respect to the various views provided in the figures, and is in no way intended as being limiting.

Attention is now directed to the figures wherein like reference numbers may be used to refer to like items throughout the various views. One embodiment of a geometric diode is shown in the diagrammatic plan view of FIG. 1, generally indicated by the reference numeral 10. As the term is used herein and in the appended claims, a geometric diode is a diode that rectifies an alternating current as a result of the physical geometry of the device. Diode 10 can include a patterned thin film of an electrical conductor such as, for example, a metal. Additional details will be provided below with regard to the various materials from which the diode can be formed. For the moment, it is sufficient to note that the material is an electrical conductor having a mobile charge carrier density that is characteristic of an electrical conductor. A number of charge carriers are diagrammatically shown, some of which are indicated by the reference number 12. Further by way of example, the thin film can be 10 nm thick and 10 nm wide in straight regions 14 and 16, 50 nm wide at the base of the triangular arrowhead, and with a triangle length of 40 nm. An arrowhead shaped region 18 separates straight regions 14 and 16. It should be appreciated that diode 10 includes a peripheral surface configuration which, in this example, is defined by an arrangement of peripheral sidewalls 20 that extend between an upper surface 22 and a lower surface (not visible in the present view). The lower surface can be supported on a suitable substrate (not shown) such as, for example, glass, plastic or a semiconductor. Regions 14 and 16 support and or define a pair of electrodes 30 and 32, respectively, to facilitate external electrical connections with the diode. The electrodes may be formed in any suitable manner such as, for example, by sputtering and from any suitable materials such as, for example, chromium overcoated with gold. In one embodiment, electrical connections can be made directly with the electrically conductive material from which the diode is formed. In any case, the material from which the geometric diode is formed, therefore, serves to define an electrically conductive path that extends between the electrodes. As will be seen, the geometric diode operates, at least in part, as a result of the peripheral surface configuration, in this case the arrowhead shape, allowing charge carriers such as electrons, in the present example, to drift more easily to the right than to the left in the view of the figure. While not a requirement, the remaining discussions will consider that the charge carriers are electrons.

Figure 1:
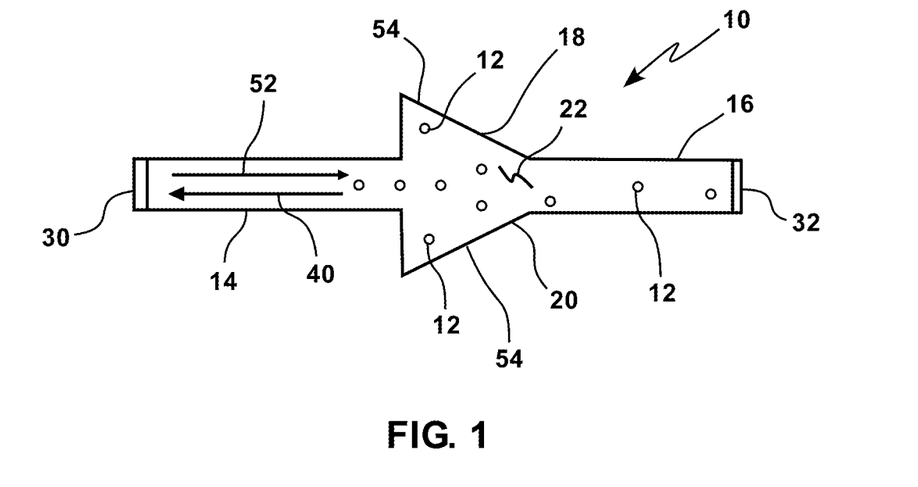
FIG. 1 is a diagrammatic plan view of a geometric diode that is produced according to the present disclosure.

Turning now to details with respect to the operation of the geometric diode, when no voltage is applied or present across the device, the equilibrium mobile electrons move with thermal energy and scatter about in the structure. As described by free-electron theory, the electrons move at a Fermi velocity of about $10^8$ cm/s (which is greater than the thermal velocity). The motion is described reasonably well by the Drude model, such that the electrons travel in a random direction between collisions for an average collision time, which is a function of the material properties and the temperature.

Figure 2:
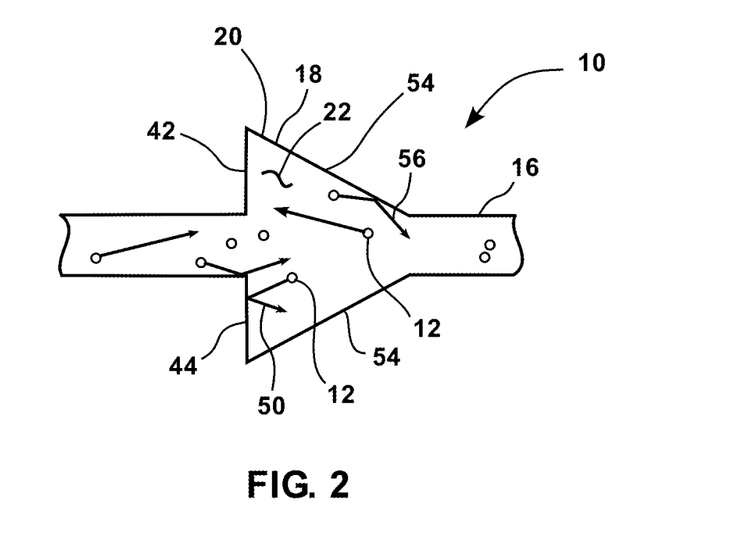
FIG. 2 is a further enlarged diagrammatic plan view of the geometric diode of FIG. 1, shown here to illustrate further details of its operation.

Turning to FIG. 2, which is a partially cutaway diagrammatic plan view of geometric diode 10, it is assumed that electrons 12 reflect substantially specularly when they encounter an edge, so that motion of the electrons is represented by the arrows in FIG. 2 wherein the angle of reflection of an electron is equal to that electron's angle of incidence. By "substantially specularly" and like terminology Applicant intends to encompass a statistical distribution of reflection angles that, on average, exhibit some tolerance of specular reflection that differs from reflection at a random angle. With no voltage affecting the electrons, equal numbers of electrons are randomly scattered to the right and to the left, and there is no net current.

Turning again to FIG. 1, when the electrons are subject to the electric field of a voltage, however, the situation changes. Consider the case when a negative voltage is applied to the right side of the device and the left side is grounded. In this case, there is an electric field attracting the electrons to the left, as indicated by an arrow 40 in FIG. 1. The electron movement is dominated by the random thermal motion, with a small but constant superimposed drift to the left in response to the applied electric field. In a normal strip of conductor, this drift field would result in a corresponding electron current to the left. However, in this structure, an electron encountering region 18, shaped like an arrowhead, is impeded somewhat. In particular, if a leftward moving electron scatters off one of two edges 42 and 44 of the device which are substantially normal to the conductive path, that electron will reflect back in the rightward direction, as represented by an arrow 50 in FIG. 2. By the term "substantially normal" and like terminology Applicant intends to encompass orientations that are at least within some tolerance of normal that result in an insubstantial effect on device operation. Thus, the electron current in the direction of arrow 40 is lower than it would be in the absence of the normally oriented edges and is considered as a reverse current flow direction of diode 10.

Now consider the case when a positive voltage is applied to the right side of the device and the left side is grounded. In this case, there is an electric field attracting the electrons to the right, as indicated by arrow 52 in FIG. 1. The electron movement is dominated by the random thermal motion, with a small but constant superimposed drift to the right in response to the applied electric field. In this structure, an electron encountering diode region 18, shaped like an arrowhead, can be impeded somewhat but less so than in the case of the opposite voltage. In this regard, if a rightward moving electron scatters off one of two diagonal peripheral sidewalls 54 of the device, that electron will reflect but can still continue moving to the right, as shown by arrow 56 in FIG. 2. Thus, the electron current in the direction of arrow 52 is higher than the electron current in the opposite direction for an equal but opposite electric field and is considered as a forward electron current flow direction of diode 10.

In this way, the structure acts as a diode, allowing more current to flow in response to positive voltage applied to the right-hand side than for a negative voltage of the same magnitude. It is to be understood there is a need for the presence of an electric field for the geometric diode to operate since power cannot be generated from purely random motions of charge carriers such as electrons. Rectification takes place in the presence of the electric field preferring electrical current in one direction over an opposite direction. The electric field can arise in a number of ways including the application of an AC voltage between the electrodes, a DC bias between the electrodes, a combination of an applied AC voltage and DC bias between the electrodes, an AC electrical response from an antenna that is connected electrically to the diode, the combination of an AC electrical response from an antenna and a DC bias between the electrodes, such that the aforementioned DC biases can be applied or be self-biases formed by the diode response to the AC voltage. While the sidewalls of the device are shown as straight, they can be curved and even profiled vertically so long as they continue to function in a manner that maintains the desired current flow.

In one embodiment, the size of the geometric diode is approximately the size of the electron mean free path, i.e., the distance traveled ballistically between scattering events. The electron mean free path is a characteristic of the material from which the geometric diode is formed and represents the average distance between scattering events encountered by a charge carrier in the material. The scattering events can result, for example, from the charge carrier encountering a thermal vibration, defect, impurity or surface. It is noted that scattering events wherein the electron encounters and reflects from the device surface configuration in a substantially specular direction are elastic events that take place during ballistic transport of the electron. For silver and gold, the mean free path is at least approximately 10 nm to 60 nm at room temperature. Therefore, in one embodiment, the device size may be on that scale, i.e., approximately between 10 nm and 100 nm. It should be appreciated that there is no threshold that represents a cut-off length of the mean free path for ballistic transport in materials. As opposed to a cut-off type behavior, the availability of ballistic transport appears to simply taper off with increasing distance until a level is reached at which ballistic transport is inconsequential. It is noted that the operation of the geometric diode, as taught herein and unlike the Song Patent that is discussed above, is neither premised upon nor does it require the formation a depletion layer.

Referring to FIG. 1, it should be appreciated that the device size can be characterized in at least two ways. In a first embodiment, the device may be considered as defining the electrically conductive path between electrodes 30 and 32 such that the distance between the electrodes is related to or on the order of the mean free path length to provide for electrons to travel ballistically along the entire length of the path from one electrode to the other without experiencing a scattering event. This form of device may be referred to herein as a mode 1 device. Device 10, in being formed from an electrically conductive material, can operate according to this mode but is not limited to operation in this mode. On the other hand, this is a limitation that is applicable to semiconductor ballistic devices that lack a significant equilibrium mobile charge density. Such semiconductor devices, in behaving in the manner of a semiconductor, generally exhibit small numbers of mobile electrons such that current flow would require that each injected electron travels the entire length of the device from one electrode to the other electrode.

In a second embodiment, having an equilibrium mobile charge density of $10^{18}$ or more per cubic centimeter, device 10 may define the electrically conductive path between electrodes 30 and 32 such that the distance between the electrodes can be significantly longer than the mean free path length so that it is improbable that an individual electron could ballistically travel the entire length of the electrically conductive path from one electrode to the other. An electron attempting to travel from one electrode to the other may be subjected to an inelastic collision, at which point any adjacent electron in the conductive medium carries the current such that a cooperation exists among equilibrium mobile electrons that are present in the electrically conductive material. As needed for most practical applications, this current flow will be available under room temperature conditions. As a result of using the electrically conductive material, essentially no limitation is imposed upon the distance between the electrodes of the diode, however, at least one critical dimension of the device should be maintained, as will be described in further detail at one or more appropriate points hereinafter. In contrast to the case of insulating or semiconducting materials, where current is carried by the charge injected into the material, in a conducting material having a substantial concentration of equilibrium mobile charge, the diffusion and drift of this equilibrium charge contributes to the current and, in conjunction with the asymmetric geometry, to the diode behavior of a geometric diode. It is noted that the behavior of a semiconductor can be modified, however, to mimic the behavior of an electrically conductive material, if the material is heavily doped to achieve equilibrium mobile charge density on the order of $10^{18}$ per cubic centimeter or greater. In this way, the material can conduct current in the same basic manner in which a metal or electrical conductor conducts electrical current wherein current can result from transport of the equilibrium mobile charge as opposed to injecting charge into a material structure that is devoid of mobile electrons, at least from a practical standpoint. It is noted that typical metals have an equilibrium mobile charge density of $10^{22}$ per cubic centimeter or more. Further, a device operating in accordance with this mode of operation may be referred to herein as a mode 2 device.

According to the Drude model electrons may be viewed as hard balls bouncing off immobile atoms and defects, such that the velocity of the balls is determined by their thermal energy and force from an applied electric field between collisions.

In reality, aside from Drude behavior, other effects are likely to come into play. At the lower end of the size scale, quantum size effects may appear in the nanostructures. With careful modeling and design, it is likely that these quantum size effects can be used to enhance the diode operation. Other modifications to Drude model behavior may result from electron collisions at the top and bottom surfaces of the metal, and the actual angle of electron reflections. Other effects may come into play with respect to the use of the geometric diode in photovoltaic applications, as will be further discussed.

While it should be appreciated that the geometric diode described herein may be used in a wide variety of applications, as is the case with any diode, the discussion which follows is directed to its use for receiving electromagnetic radiation, for example, in photovoltaic applications, detector applications and in thermophotovoltaic power converter applications. To provide high efficiency photovoltaic rectifiers, a diode should have the following characteristics:

1. High-frequency response. The roughly black-body solar spectrum includes significant irradiance extending to $10^{15}$ Hz, requiring a diode that rectifies at 1 PHz. In the case of prior art metal-insulator diodes, the fundamental tunneling mechanism is on the order of femtoseconds, but parasitics (RC time constant) limit the diode response to at least an order of magnitude below the desired frequency. Therefore not only must the fundamental response time be extremely short, but also the capacitance must be extremely small. Thermophotovoltaic (TPV) systems operate at longer wavelengths, and hence diodes for a rectifying TPV system need operate up to "only" $10^{14}$ Hz. Material selection for the geometric diode may be made in view of the need for high frequency response. As an example, the collision time for bulk metals of interest, such as silver, is approximately $10^{-14}$ s at room temperature. This is not quite short enough to capture the entire near-infrared and visible part of the solar spectrum. The actual collision time in thin films may be shorter due to the presence of additional interfaces and defects. Because the collision time scales inversely with mean free path, and the mean free path may be larger than necessary, the mean free path can be reduced by reducing the size of the device, introducing defects, for example by texturing the surface, or introducing charged impurities. In this tradeoff, the resulting device will have a faster response time, and hence be able to rectify higher frequencies, at the cost of having a shorter mean free path, hence requiring the fabrication of a smaller device having a smaller critical dimension.

2. Asymmetry. The current-voltage [I(V)] curve should be sufficiently asymmetrical to yield high output power. This requirement is relaxed somewhat because of the photon energies involved. For lower frequencies, corresponding to mid-infrared and longer wavelengths, one can use classical rectifier concepts to calculate the power conversion efficiency. However, at visible wavelength frequencies, the photon energy is on the order of the voltage (times the electronic charge) range over which the I(V) curve nonlinearity appears. In this photon energy range, a semi-classical/quantum approach that makes use of photon energy steps in the I(V) curve is required. This gives substantially higher rectification than a pure classical approach would. From the simple Drude model picture, the I(V) asymmetry of the geometric diode appears to be substantial, and the inclusion of quantum effects is likely to further improve both the I(V) asymmetry and performance in photovoltaic rectification, detector, and thermophotovoltaic applications.

3. Impedance matching. To reasonably efficiently transfer power from an antenna to the diode, the two elements should be matched in terms of electrical impedance. This has been difficult to achieve using prior art diodes. The antenna impedance tends to be low, in the 100's of ohms. To reduce the parasitic capacitance and hence the time constant of a prior art diode, the diode is usually made very small and therefore problematically usually has an impedance far larger than that of the antenna. Accordingly, the coupling loss has been a major problem. The impedance of the geometric diode will be small at least for the reason that the device is itself formed from an electrical conductor and, therefore, well-matched to antennas by exhibiting a lower impedance, for example, in a range from 10 ohms to 10,000 ohms. In this regard, the peripheral outline of the geometric diode can be customized in order to target a desired impedance for purposes of matching the diode to a specific antenna impedance, for example, by changing its thickness or length-to-width ratio. Accordingly, the geometric diode avoids the problems described above relating to capacitance of prior art parallel-plate sandwich type diodes and their associated impedance.

MATERIALS

Having mentioned silver above, it is appropriate at this juncture to provide further details with respect to this material. The series resistance of an Ag strip that is 100 nm long, 10 nm wide, and 10 nm thick is approximately 15Ω. Adding the resistance from the geometric asymmetry results in a differential resistance of about 10-1000Ω more than that, which is in the right range for being impedance-matched to an antenna.

Gold exhibits a mean free path that is on the order of a few tens of nanometers, similar to that of silver, and is therefore a useful material. It has the additional advantage over silver that it does not oxidize and therefore forms a stable thin film.

Graphene is a material that is made up of planar sheets of carbon. While graphene is currently difficult to fabricate on a commercial scale, this material is of interest since it exhibits a very large mean free path. The use of conductive graphene may provide for producing a relatively larger device while still meeting requirements for device size and critical dimensions/features as discussed throughout this disclosure.

However, as will be understood by those having ordinary skill in the art with this overall disclosure in hand, the material can be any conducting material, including metals, plasmas, conductive semiconductors and conductive polymer materials, among others. Further, although the shape of the diode shown thus far is that of a simple arrowhead, it should be understood that the diode can take on a wide variety of shapes, so long as they are asymmetric with respect to the two directions of current flow. The device can be a formed from a single diode or as a series cascade of diodes, yet to be described. The devices can be flat (i.e., planar) in the third dimension, or structured in the third dimension, as will be further described. In particular, the third dimension shaping can enhance the diode effect.

The concepts described herein can be expanded to include the design and fabrication of other devices besides diodes. For example, a voltage applied to a third electrode spaced at a small distance from a conducting strip can be used to alter the scattering of electrons at the edges of the strip as they pass the third electrode. In this way, the concept can be applied to form field-effect transistors and like devices.

These devices can be used in a wide range of applications. Such applications include but are not limited to ultra-high-speed circuits for terahertz electronics, optical communications, thermoelectric generators and thermoelectric coolers, and the like. As described herein, these devices can be used to rectify solar radiation received by micro-antennas, to form solar cells. In each case, geometric diode characteristics including high speed, low electrical resistance, low capacitance, and/or ease of manufacturing provide benefits. In the case of thermoelectric devices, there is an additional characteristic that provides a benefit. The figure of merit for thermoelectric devices is proportional to the electrical conductivity divided by the thermal conductivity. As described herein, the electrical conductivity of geometric diodes can be made large. Because the device can be planar such that the thermal conduction between electrodes can proceed along a thin film, the thermal conductivity can be designed to be substantially smaller than for sandwich-structure diodes, in which a large area and small thickness results in high thermal conductivity. Therefore, the additional characteristic of low thermal conductivity provides a benefit for certain applications.

Antennas

The geometric diode can be coupled with an antenna for use in photovoltaic or detector applications. The prior art describes metal-insulator tunnel-diode devices coupled with planar bowtie and dipole antennas. Such antennas are relatively straight-forward to fabricate, and should be useful with planar geometric diodes. A single metal deposition and nanoimprint lithography step can produce an entire photovoltaic rectifier array.

Figure 3:
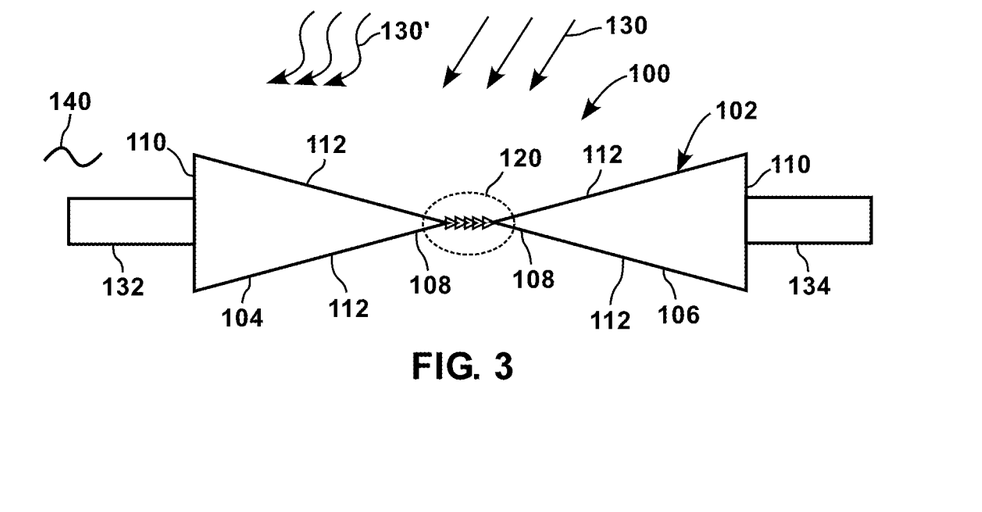
FIG. 3 is a diagrammatic plan view illustrating one embodiment of a photovoltaic rectifier arrangement.

FIG. 3 is a diagrammatic plan view showing a layout for a photovoltaic rectifier that is generally indicated by the reference number 100. An antenna 102 is planar and in the form of a bowtie. In a solar cell, a large array of such devices can be laid out on a suitable insulating substrate such as, for example, glass or plastic. In operation, the glass side is exposed to the solar radiation, and the pattern side is face down and surrounded by an air gap or an appropriate dielectric encapsulant. In the present example, planar antenna 102 includes an opposing pair of first and second bow arms 104 and 106, respectively. Each bow arm includes an innermost apex end 108 and an outermost edge 110. A pair of outwardly diverging edges 112 extend between each apex end 108 and each outermost edge 110 of each bow arm. Apex ends 108 of the bow arms are in electrical communication with a rectifier arrangement 120 (shown within a dotted line), as will be described in further detail immediately hereinafter.

Figure 4:
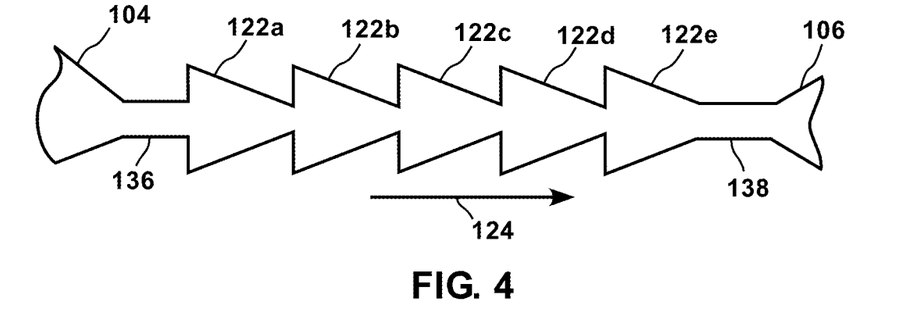
FIG. 4 is a further enlarged view of a portion of the view of FIG. 4, shown here to illustrate a cascade configuration of geometric diodes.

Attention is now directed to FIG. 4 in conjunction with FIG. 3. The former is a further enlarged diagrammatic plan view of rectifier arrangement 120. In this example, the rectifier arrangement includes a series or cascade connection of five geometric diodes indicated as 122*a-e*, although any suitable number of diodes may be used including a single diode. These diodes operate in a manner that is consistent with the descriptions above to define a forward direction 124 of current flow that is indicated by an arrow. The arrangement receives solar electromagnetic radiation 130 (FIG. 3) which is rectified to DC power that is available at electrodes 132 and 134 to the left and right of the antenna. The placement of the electrodes at the two outermost edges 110 preclude the loss of the optical frequencies to the electrodes. It is noted that the solar power is available directly from regions 136 and 138 between the antenna and the geometric diode array. The solar power may be extracted using any suitable electrical connections providing electrical communication with the system. While the geometric diode or diodes require the presence of an electric field for their operation, in the application of a solar cell, the system may be self biasing such that exposure to solar energy will cause a bias voltage to be produced spontaneously, likely within a few milliseconds of exposure to the solar radiation. In other applications, such as detectors, the geometric diode may be used in a zero bias configuration or with an applied bias.

Referring to FIG. 3, it should be appreciated that in another embodiment, the arrangement of FIG. 3 can be configured as a detector arrangement that receives a modulated input electromagnetic radiation 130' which contains a signal that is to be demodulated. A recovered electrical signal response 140 is available, for example, across electrodes 132 and 134.

Figure 5:
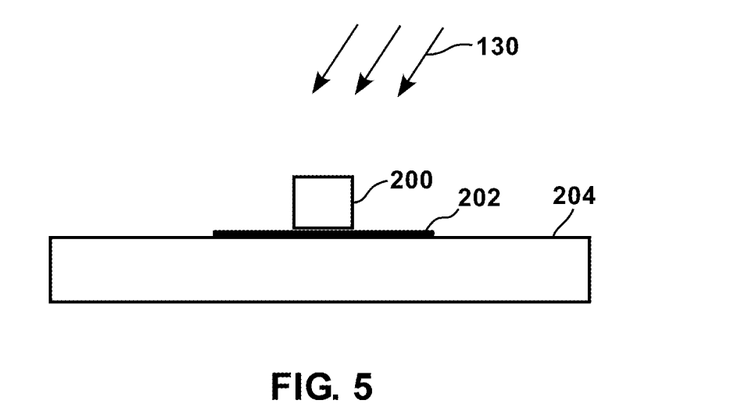
FIG. 5 is a diagrammatic illustration, in an elevational view, of an assembly including a dielectric antenna that is coupled with a geometric diode.

Referring to FIG. 5, another potentially useful antenna is a rod-shaped dielectric leaky-wave antenna 200, instead of a metal antenna to couple electromagnetic radiation into a geometric diode. The antenna, in this embodiment, is supported on a geometric diode 202 which is, in turn, supported on a substrate 204. Such dielectric antennas can reduce the conduction losses associated with metallic antennas in the rectification of solar radiation. The placement and orientation of the diode or diodes underneath the dielectric antenna can be chosen so as to maximize the excitation of currents in the electrically conductive material of the diode due to the electromagnetic modes within the dielectric antenna.

Fabrication

The geometric diode can advantageously be relatively simple to manufacture. For example, the diode can be formed as a single patterned layer of electrically conductive material on a suitable insulating substrate such as, for example, glass. Alternatively, to improve adhesion to the glass or to reduce resistive losses, multiple layers of material may be patterned along with the primary conductive material. In production, the geometric diode and associated structures can be produced much like DVDs are stamped out, using nano-imprint technology. Nano-imprint technology involves producing a physical mold which can then be used to produce relatively extraordinary numbers of devices. The physical mold itself can be produced, for example, by focused ion beam lithography or high energy electron beam lithography. Accordingly, solar cells that employ geometric diodes are therefore expected to be less expensive than any other photovoltaic technologies.

Figure 6:
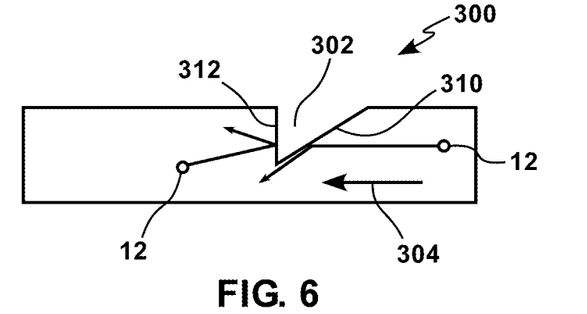
FIG. 6 is a diagrammatic elevational view of an electrically conductive material defining an asymmetric groove that can produce diode behavior.

Turning now to FIG. 6, a diagrammatic elevational view of an electrically conductive material is shown and generally indicated by the reference number 300. It is to be understood that material 300 can be supported on a suitable substrate (not shown). In this embodiment, an asymmetric feature is provided by way of an asymmetric groove 302 that is defined by material 300. The reader will recall that, in FIG. 1, the asymmetric feature is arrowhead region 18. It should be appreciated that a geometric diode can be formed from thin film with a pattern etched into it, or with protrusions extending out of it. Accordingly, the remaining electrically conductive material defines one-half of an inverted arrowhead shape. For electrons 12 experiencing a forward direction of current flow, those electrons moving to the left, in the view of the figure, suffer fewer reflections that reverse their direction since they may encounter a slanted wall 310 in the peripheral device configuration.

Electrons moving to the right, on the other hand, may encounter a vertical wall 312 as part of the peripheral device configuration that is substantially normal to the electrically conductive path, and hence a lower resistance is expected for an electron current traveling in forward direction 304.

Figure 7:
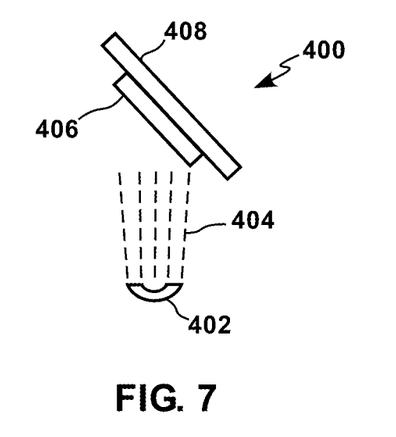
FIG. 7 is a diagrammatic view, in elevation, illustrating one embodiment of a system for producing a nano-scale asymmetrically patterned metal layer.

Referring to FIG. 7, a diagrammatic view, in elevation, illustrates one embodiment of a system, generally indicated by the reference number 400 for producing a nano-scale asymmetrically patterned metal layer. In particular, a source such as, for example, a thermal evaporator 402 is arranged to deposit an evaporated electrically conductive material 404 onto a substrate 406 that is supported in an oblique orientation by a substrate support 408 with respect to the evaporator.

Figure 8:
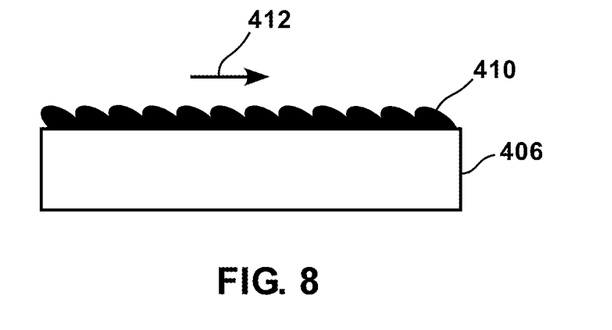
FIG. 8 is a diagrammatic view, in elevation of a substrate that supports an electrically conductive film formed by the system of FIG. 8.

The result of the system and process shown in FIG. 7 is diagrammatically illustrated in the elevational view of FIG. 8 wherein substrate 406 supports an electrically conductive film 410 having an asymmetric configuration as shown to produce a tilted columnar structure. Based on the teachings that have been brought to light herein, film 410 can operate in the manner of a cascade of geometric diodes defining a forward direction 412 of current flow which is indicated as an arrow. In another embodiment, based on the same concept of oblique evaporation of asymmetric columnar films, an insulating material may be substituted for material 404, resulting in a substitution of insulating material for film 410. Then another metal thin film (not shown) can be deposited on top of the insulating asymmetric columnar film and coat it to form a conformal conducting layer. This conformal conducting layer then has the desired characteristics of a cascade of geometric diodes based on geometry that is similar to layer 410.

Figures 9, 10, 11:
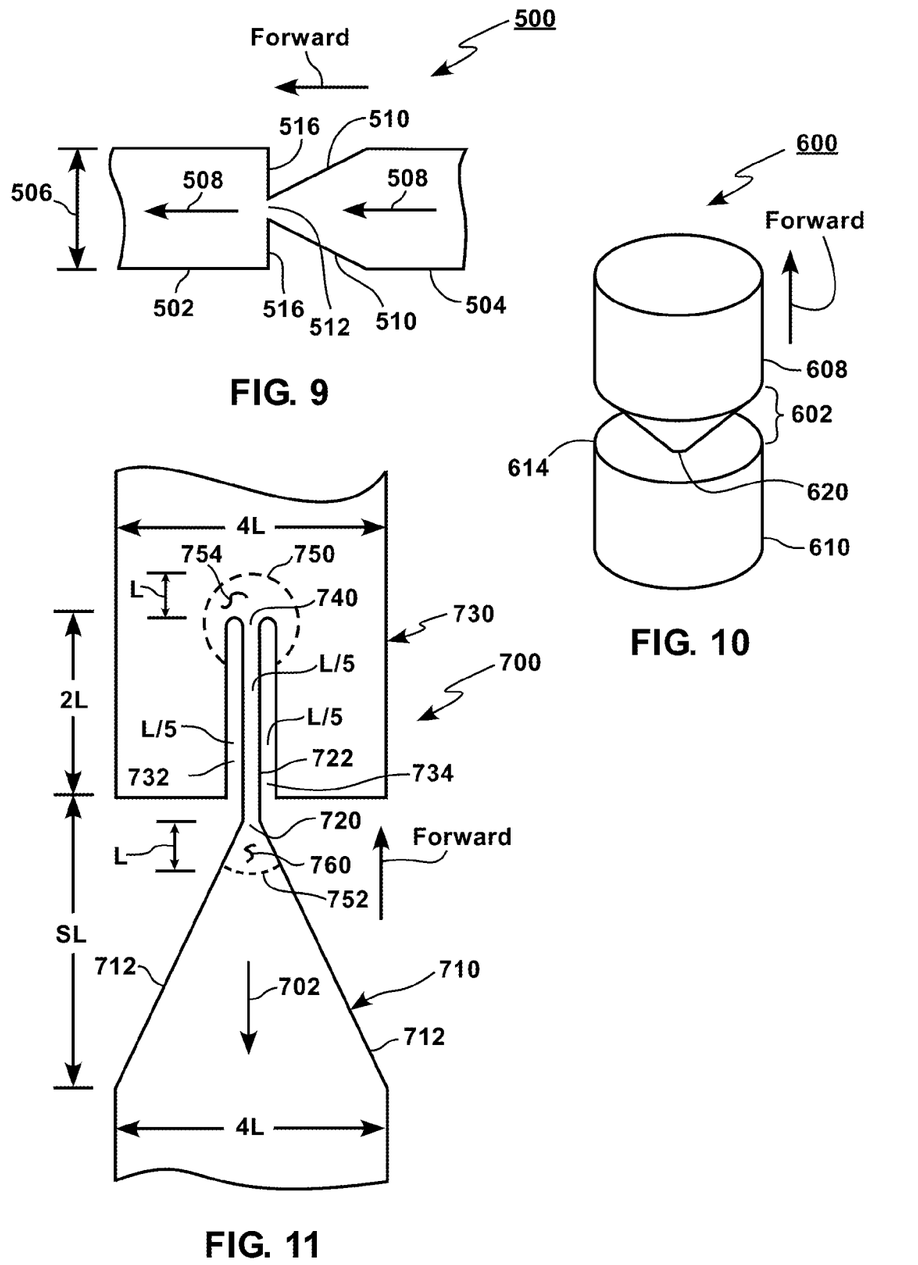
FIG. 9 is a diagrammatic plan view of another embodiment of a geometric diode, in a planar configuration, produced according to the present disclosure.
FIG. 10 is a diagrammatic perspective view of one embodiment of a volumetric, three-dimensional geometric diode.
FIG. 11 is a diagrammatic plan view of another embodiment of a planar geometric diode, produced according to the present disclosure.

FIG. 9 is a diagrammatic plan view of another embodiment of a geometric diode that is generally indicated by the reference number 500. Diode 500 is formed as a patterned electrically conductive layer. Regions 502 and 504 adjoin the diode and are of a generally uniform width 506. The device can be formed as having an overall device size in one embodiment that is configured as a mode 1 device to provide for ballistic electron travel through the entire length of an electrically conductive path 508 (shown using arrows) that is defined by the device or in another, mode 2 embodiment in which it is only necessary for one or more critical dimensions to make use of more limited-range ballistic electron transport that establishes the forward direction of current flow. Regions 502 and 504 may be elongated to essentially any desired length for a mode 2 device so as to extend to electrodes (not shown). The diode region is formed to include slanted sidewalls 510 that diverge from an aperture 512 and lead to region 504. These slanted sidewalls tend to reflect electrons to maintain movement of electrons in the forward direction. While the sidewalls are shown as straight, they can be curved and even profiled vertically so long as they continue to function in a manner that maintains the desired current flow. It should be noted that the term aperture, as used throughout this disclosure, refers to a feature through which electrons ballistically travel due to its size in comparison with the mean free path length, as opposed to referring to a physical void or hole. That is, the aperture is small enough that ballistic travel takes place in view of the mean free path length. While the amount of ballistic travel that occurs between a single pair of collisions falls off gradually for aperture, feature and device sizes that are greater than the mean free path length, for aperture, feature and device sizes less than the mean free path length, such ballistic travel is assured, at least from a practical standpoint. Sidewalls 516 are arranged at least generally normal to electrically conductive path 508, serving to terminate region 502 and to produce reflections that tend to reverse a portion of the flow of electrons that are traveling in the reverse direction. In one mode 2 embodiment using a metal such as gold to form the device, width 506 of elongated regions 502 and 504 can be approximately 1 nm and a projection of slanted sidewalls 510 onto the electrically conductive path can be approximately 10 nm in length. It is noted that the width of the device has been exaggerated and is not to scale relative to the length of the device. Aperture 512 can serve as a primary critical dimension having a width that is significantly less that the mean free path length such as, for example, one-fifth of the length of the mean free path length. Further, the distance from the aperture to the asymmetry serves as a secondary critical dimension. This is the distance between aperture 512 and slanted sidewall 510, and also the distance between aperture 512 and normal sidewalls 516. In FIG. 9 features 512 and 510, and also features 512 and 516 are directly adjacent to each other and are therefore within a mean free path length. Accordingly, the asymmetric structure proximate to aperture 512 serves to reflect at least a portion of the charge carriers traveling in the electrically conductive material such that more of that portion of charge carriers is reflected toward the forward direction than toward the reverse direction to cause the forward current flow to be greater than the reverse current flow when a forward bias is present from the first electrode to the second electrode. In this regard, it is to be understood that the electrode connections are not visible in the enlarged view of FIG. 9 but are present outwardly to the left and right in electrical communication with regions 502 and 504.

FIG. 10 illustrates one embodiment of a volumetric three-dimensional structure, generally indicated by the reference number 600, seen in a diagrammatic perspective view. In this embodiment, a geometric diode region 602 separates opposing cylindrical volumes 608 and 610. A frustoconical volume 614 leads from volume 608 to an aperture 620 wherein at least aperture 620 can serve as a critical dimension connected to volumetric region 610. It should be appreciated that volumetric three-dimensional structures may be produced in an unlimited variety of configurations and are not limited to surfaces of rotation while continuing to fall within the scope of the present disclosure. Moreover, such structures may be supported in any suitable manner, for example, on any suitable substrate.

Referring now to FIG. 11, another embodiment of a geometric diode is diagrammatically shown in a plan view and generally indicated by the reference number 700. Diode 700 is formed as a patterned electrically conductive layer disposed on a suitable substrate (not shown), but the concepts that are brought to light herein are equally applicable with respect to other structures including three-dimensional structures. While diode 700 provides an asymmetric structure along an electrically conductive path 702 between two electrodes and/or antenna arms (not shown due to illustrative constraints). The operation of this diode, unlike those described above, does not rely on the mechanism of reflection. It is noted that dimensions have been applied to the structure in the figure in terms of the mean free path length L. A first region 710 includes sidewalls 712 that taper to a first aperture 720 which serves as one end of a narrow track 722 that is of width L/5, such that the first aperture and the track width serve as critical dimensions. Track 722 is separated from a second region 730 at each side by a first gap 732 and a second gap 734. These gaps are each of width L/5. The track itself is of a length 2L extending to a second aperture 740 which is of width L/5. Region 730 is of width 4L.

Having described the structure of geometric diode 700, its operation will now be described. For purposes of facilitating this discussion, a portion of a dashed circle 750 having radius L is drawn having is center centered on second aperture 740. A dashed arc 752, which is a portion of a second circle having radius L, is drawn having its center centered on first aperture 720. It should be appreciated that a volume 754 of material that is encompassed by dashed circle 750 is within the mean free path length of the second aperture such that electrons within that material volume can ballistically reach the immediate proximity of the second aperture in one scattering distance. For first aperture 720, likewise, electrons within a volume 760 of material within arc 752 are sufficiently close to the first aperture such that these electrons can ballistically reach the first aperture. Volume 760, however, is much smaller in size as compared to volume 750. For this reason, the amount of equilibrium electrons that is available for transit through track 722 is greatest when traveling from second aperture 740 to first aperture 720 therefore resulting in an excess concentration of electrons in the vicinity of aperture 740 as compared to the vicinity of aperture 720. This excess electron concentration creates a built-in electric field that tends to oppose further electron transport from region 730 into track 722. This produces diode behavior with a forward direction for electron current that is upward in the view of the figure, as indicated. It should be appreciated that the structure and dimensional details with regard to diode 700 can be modified in a wide variety of ways while remaining within the scope of the teachings that have been brought to light herein. Moreover, it should be appreciated that track 722 itself operates as an extended aperture that extends between volumes 750 and 760. In particular, rectifying or diode behavior can result on the basis of the amount of volume of equilibrium mobile charge density that is available to a critical dimension such as an aperture. Further, diode 700 operates in this manner with no need for reliance on reflection, but rather only on constraints imposed by the geometry of the peripheral device surface configuration. The term diode behavior refers to the unidirectionality that diodes exhibit which may also be generically called a rectifying property. Diode behavior also provides for detection or demodulation of electromagnetic signals.

In view of the various embodiments described above, it should be appreciated that the charge carriers pass through an aperture, or set of apertures, in a geometric diode such that the physical configuration is different on one side of the aperture as compared to the other (the "asymmetry"). The primary critical dimension is the size of the aperture, which is its width in the case of thin-film structures, or its width or height in the case of volumetric structures. A secondary critical dimension is the distance from the aperture to the asymmetry. The asymmetry can be formed, in some embodiments, on the basis of its behavior with respect to reflection of charge carriers and, in other embodiments, on the basis of its behavior with respect to the volume of equilibrium mobile charge carriers that are readily within one scattering distance (which can be the mean free path length) of the aperture. Either one of the primary or the secondary critical dimension or both should be no more than a certain factor of the charge-carrier mean-free path length. Depending on the particular structure and the degree of asymmetry required in the current-voltage characteristics, this factor is typically between 0.1 and 10 times the mean-free path length. Accordingly, a useful device can be produced having a critical dimension that is less than or equal to three times the mean free path length in order to maintain sufficient ballistic travel with respect to the mean free path length.

Figure 12:
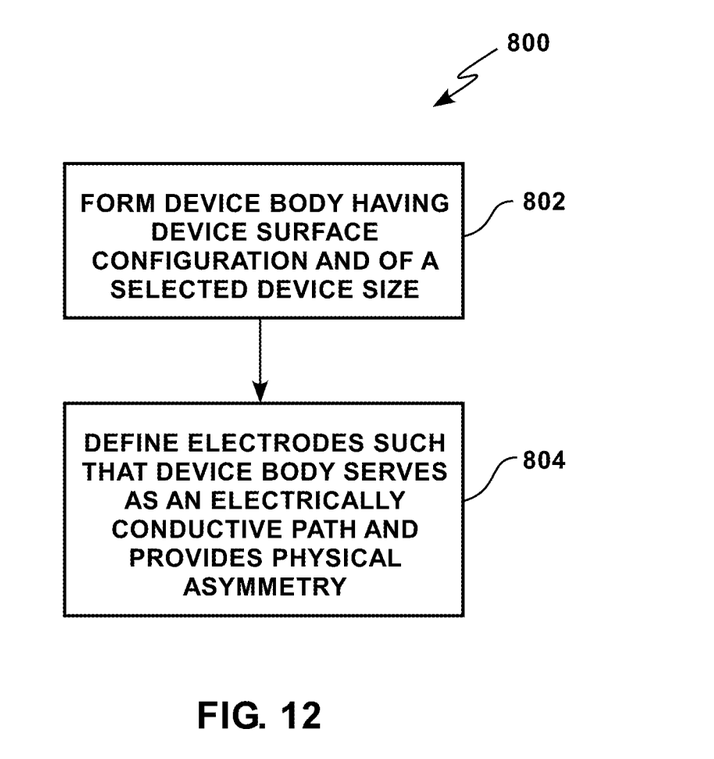
FIG. 12 is a flow diagram illustrating one embodiment of a method according to the present disclosure.

FIG. 12 illustrates one embodiment of a method for producing a geometric diode according to the present disclosure, generally indicated by the reference number 800. At 802, a device is formed an electrically conductive material having an equilibrium mobile charge density and having a device surface configuration. The material is characterized by a charge carrier mean free path having a mean free path length and a device size is selected for the device body based on the mean free path length. At 804, at least a pair of first and second electrodes is defined on the device body such that the device body serves as an electrically conductive path between the first and second electrodes wherein the electrically conductive path is delimited by the device surface configuration and the device surface configuration is physically asymmetric with respect to a forward flow of current in a forward direction from the first electrode to the second electrode as compared to a reverse current flow in an reverse direction from the second electrode to the first electrode such that a magnitude of the current between the first electrode and the second electrode, as a function of a voltage between the pair of electrodes, is different in the forward direction from that in the reverse direction. It is noted that there is no need for the formation of a depletion layer in the electrically conductive material to produce the difference in current magnitude.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering the various sequences of which they are made up. Accordingly, having described a number of exemplary aspects and embodiments above, those of skill in the art will recognize certain modifications, permutations, additions and sub-combinations thereof It is therefore intended that the following appended claims and claims hereafter introduced are interpreted to include all such modifications, permutations, additions and sub-combinations as are within their true spirit and scope.

CONCEPTS

As short summaries, this writing has disclosed at least the following broad concepts.

Concept 1. A geometric diode, comprising:
a device body formed from an electrically conductive material having an equilibrium mobile charge density, and the device body is formed having a device surface configuration, said material further being characterized by a charge carrier mean free path having a mean free path length and said device body having a device size that is selected based on said mean free path length; and
at least a pair of first and second electrodes defined on the device body such that the device body serves as an electrically conductive path between the first and second electrodes wherein the electrically conductive path is delimited by the device surface configuration and the device surface configuration is physically asymmetric with respect to a forward flow of current in a forward direction from the first electrode to the second electrode as compared to a reverse current flow in an reverse direction from the second electrode to the first electrode such that a magnitude of the current between the first electrode and the second electrode, as a function of a voltage between the pair of electrodes, is different in the forward direction from that in the reverse direction without a need for the formation of a depletion layer in the electrically conductive material to produce the difference in current magnitude.

Concept 2. The geometric diode of concept 1 wherein the magnitude of current flow in the forward direction from the first electrode to the second electrode as compared to the magnitude of current flow in the reverse direction from the second electrode to the first electrode exhibits a diode behavior.

Concept 3. The geometric diode of concept 1 wherein said device surface configuration defines at least one critical dimension that is less than or equal to ten times the mean free path.

Concept 4. The geometric diode of concept 3 wherein said critical dimension is less than or equal to three times the mean free path length.

Concept 5. The geometric diode of concept 3 wherein the critical dimension is a width of the electrically conductive path.

Concept 6. The geometric diode of concept 1 wherein the equilibrium mobile charge density is at least $10^{18}$ cm$^{-3}$ such that the electrically conductive material itself supports current flow.

Concept 7. The geometric diode of concept 1 wherein said device surface configuration is configured to reflect at least a portion of the charge carriers traveling in the electrically conductive material such that more of that portion of charge carriers is reflected toward the forward direction under a given forward bias having a given magnitude than toward the reverse direction under a reverse bias of said given magnitude to cause the forward current flow to be greater than the reverse current flow.

Concept 8. The geometric diode of concept 1 configured to respond to an applied frequency up to at least $10^{15}$ hertz.

Concept 9. The geometric diode of concept 1 configured with an impedance between said pair of electrodes in a range from 10 to 10,000 ohms.

Concept 10. The geometric diode of concept 1 wherein said electrically conductive material is a metal.

Concept 11. The geometric diode of concept 1 wherein said electrically conductive material is graphene.

Concept 12. A system comprising:
an antenna for receiving electromagnetic radiation; and
the geometric diode of claim 1 configured for coupling with said antenna to receive said electromagnetic radiation to produce an electrical response that is available across said pair of electrodes.

Concept 13. The system of concept 12 wherein the electromagnetic radiation is solar radiation and said geometric diode generates electrical power responsive to said solar radiation as said electrical response for an external use.

Concept 14. The system of concept 12 wherein the electromagnetic radiation is modulated with a modulation signal and said geometric diode detects the modulation signal as part of said electrical response based on said diode behavior to produce a demodulated signal across said first and second electrodes responsive to said modulation signal.

Concept 15. A method, comprising:
forming a device body from an electrically conductive material having an equilibrium mobile charge density and having a device surface configuration, said material being characterized by a charge carrier mean free path having a mean free path length;
selecting a device size for the device body based on said mean free path length; and
defining at least a pair of first and second electrodes on the device body such that the device body serves as an electrically conductive path between the first and second electrodes wherein the electrically conductive path is delimited by the device surface configuration and the device surface configuration is physically asymmetric with respect to a forward flow of current in a forward direction from the first electrode to the second electrode as compared to a reverse current flow in an reverse direction from the second electrode to the first electrode such that a magnitude of the current between the first electrode and the second electrode, as a function of a voltage between the pair of electrodes, is different in the forward direction from that in the reverse direction without a need for the formation of a depletion layer in the electrically conductive material to produce the difference in current magnitude.

What is claimed is:

1. A geometric diode, comprising:
a device body formed from an electrically conductive material having an equilibrium mobile charge density of at least $10^{18}$ cm$^{-3}$ such that the electrically conductive material itself supports current flow, and the device body is formed having a device surface configuration, said material further being characterized by a charge carrier mean free path having a mean free path length and said device body having a device size that is selected based on said mean free path length; and
at least a pair of first and second electrodes defined on the device body such that the device body serves as an electrically conductive path between the first and second electrodes wherein the electrically conductive path is delimited by the device surface configuration and the device surface configuration is physically asymmetric with respect to a forward flow of current in a forward direction from the first electrode to the second electrode as compared to a reverse current flow in an reverse direction from the second electrode to the first electrode such that a magnitude of the current between the first electrode and the second electrode, as a function of a voltage between the pair of electrodes, is different in the forward direction from that in the reverse direction without a need for the formation of a depletion layer in the electrically conductive material to produce the difference in current magnitude.

2. The geometric diode of claim 1 wherein the magnitude of current flow in the forward direction from the first electrode to the second electrode as compared to the magnitude of current flow in the reverse direction from the second electrode to the first electrode exhibits a diode behavior.

3. The geometric diode of claim 1 wherein said device surface configuration defines at least one critical dimension that is less than or equal to ten times the mean free path.

4. The geometric diode of claim 3 wherein said critical dimension is less than or equal to three times the mean free path length.

5. The geometric diode of claim 3 wherein the critical dimension is a width of the electrically conductive path.

6. The geometric diode of claim 1 wherein said device surface configuration is configured to reflect at least a portion of the charge carriers traveling in the electrically conductive material such that more of that portion of charge carriers is reflected toward the forward direction under a given forward bias having a given magnitude than toward the reverse direction under a reverse bias of said given magnitude to cause the forward current flow to be greater than the reverse current flow.

7. A geometric diode, comprising:
a device body formed from an electrically conductive material having an equilibrium mobile charge density, and the device body is formed having a device surface configuration, said material further being characterized by a charge carrier mean free path having a mean free path length and said device body having a device size that is selected based on said mean free path length; and
at least a pair of first and second electrodes defined on the device body such that the device body serves as an electrically conductive path between the first and second electrodes wherein the electrically conductive path is delimited by the device surface configuration and the device surface configuration is physically asymmetric with respect to a forward flow of current in a forward direction from the first electrode to the second electrode as compared to a reverse current flow in an reverse direction from the second electrode to the first electrode such that a magnitude of the current between the first electrode and the second electrode, as a function of a voltage between the pair of electrodes, is different in the forward direction from that in the reverse direction without a need for the formation of a depletion layer in the electrically conductive material to produce the difference in current magnitude and the geometric diode is configured to respond to an applied frequency up to at least $10^{15}$ hertz.

8. A geometric diode, comprising:
a device body formed from an electrically conductive material having an equilibrium mobile charge density, and the device body is formed having a device surface configuration, said material further being characterized by a charge carrier mean free path having a mean free path length and said device body having a device size that is selected based on said mean free path length; and
at least a pair of first and second electrodes defined on the device body such that the device body serves as an electrically conductive path between the first and second electrodes and configured with an impedance between said pair of electrodes in a range from 10 to 10,000 ohms wherein the electrically conductive path is delimited by the device surface configuration and the device surface configuration is physically asymmetric with respect to a forward flow of current in a forward direction from the first electrode to the second electrode as compared to a reverse current flow in an reverse direction from the second electrode to the first electrode such that a magnitude of the current between the first electrode and the second electrode, as a function of a voltage between the pair of electrodes, is different in the forward direction from that in the reverse direction without a need for the formation of a depletion layer in the electrically conductive material to produce the difference in current magnitude.

9. A geometric diode, comprising:
a device body formed from an electrically conductive material having an equilibrium mobile charge density wherein said electrically conductive material is a metal, and the device body is formed having a device surface configuration, said material further being characterized by a charge carrier mean free path having a mean free path length and said device body having a device size that is selected based on said mean free path length; and
at least a pair of first and second electrodes defined on the device body such that the device body serves as an electrically conductive path between the first and second electrodes wherein the electrically conductive path is delimited by the device surface configuration and the device surface configuration is physically asymmetric with respect to a forward flow of current in a forward direction from the first electrode to the second electrode as compared to a reverse current flow in an reverse direction from the second electrode to the first electrode such that a magnitude of the current between the first electrode and the second electrode, as a function of a voltage between the pair of electrodes, is different in the forward direction from that in the reverse direction without a need for the formation of a depletion layer in the electrically conductive material to produce the difference in current magnitude.

10. A geometric diode, comprising:
a device body formed from an electrically conductive material having an equilibrium mobile charge density wherein said electrically conductive material is graphene, and the device body is formed having a device surface configuration, said material further being characterized by a charge carrier mean free path having a mean free path length and said device body having a device size that is selected based on said mean free path length; and at least a pair of first and second electrodes defined on the device body such that the device body serves as an electrically conductive path between the first and second electrodes wherein the electrically conductive path is delimited by the device surface configuration and the device surface configuration is physically asymmetric with respect to a forward flow of current in a forward direction from the first electrode to the second electrode as compared to a reverse current flow in an reverse direction from the second electrode to the first electrode such that a magnitude of the current between the first electrode and the second electrode, as a function of a voltage between the pair of electrodes, is different in the forward direction from that in the reverse direction without a need for the formation of a depletion layer in the electrically conductive material to produce the difference in current magnitude.

11. A method, comprising:

forming a device body from an electrically conductive material having an equilibrium mobile charge density and having a device surface configuration, said material being characterized by a charge carrier mean free path having a mean free path length;

selecting a device size for the device body based on said mean free path length; and defining at least a pair of first and second electrodes on the device body such that the device body serves as an electrically conductive path between the first and second electrodes wherein the electrically conductive path is delimited by the device surface configuration and is configured with an impedance between said pair of electrodes in a range from 10 to 10,000 ohms, and the device surface configuration is physically asymmetric with respect to a forward flow of current in a forward direction from the first electrode to the second electrode as compared to a reverse current flow in an reverse direction from the second electrode to the first electrode such that a magnitude of the current between the first electrode and the second electrode, as a function of a voltage between the pair of electrodes, is different in the forward direction from that in the reverse direction without a need for the formation of a depletion layer in the electrically conductive material to produce the difference in current magnitude.

* * * * *